(12) United States Patent
Tanaka et al.

(10) Patent No.: US 9,072,148 B2
(45) Date of Patent: Jun. 30, 2015

(54) LIGHT EMITTING DEVICE, AND ILLUMINATION APPARATUS AND SYSTEM USING SAME

(71) Applicant: Panasonic Corporation, Osaka (JP)

(72) Inventors: Kenichiro Tanaka, Osaka (JP); Naoko Takei, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 31 days.

(21) Appl. No.: 13/786,862

(22) Filed: Mar. 6, 2013

(65) Prior Publication Data

US 2013/0234622 A1 Sep. 12, 2013

(30) Foreign Application Priority Data

Mar. 9, 2012 (JP) ................................ 2012-053471

(51) Int. Cl.
*H05B 37/02* (2006.01)
*H05B 33/08* (2006.01)
*H01L 25/075* (2006.01)
(Continued)

(52) U.S. Cl.
CPC ........ *H05B 33/0857* (2013.01); *H01L 25/0753* (2013.01); *H01L 33/504* (2013.01); *H05B 33/12* (2013.01); *H01L 2924/0002* (2013.01)

(58) Field of Classification Search
CPC ............. H01L 2924/00014; H01L 2933/0041; H01L 33/50; H01L 33/504; B32B 27/00; H05B 33/0857; H05B 33/12
USPC ............ 315/32, 192, 210, 297, 307; 313/487, 313/503; 362/84, 166, 230, 231, 235, 293, 362/510
See application file for complete search history.

(56) References Cited

U.S. PATENT DOCUMENTS 8,071,988 B2 * 12/2011 Lee et al. ........................ 257/88
8,262,935 B2 * 9/2012 Daicho et al. .......... 252/301.4 H
(Continued)

FOREIGN PATENT DOCUMENTS

CN 1981387 6/2007
CN 101987958 3/2011
(Continued)

OTHER PUBLICATIONS

Chinese Office Action dated Apr. 1, 2015 issued in corresponding Chinese application No. 201310074581.9 and English translation thereof.
(Continued)

*Primary Examiner* — Vibol Tan
(74) *Attorney, Agent, or Firm* — Renner, Otto, Boisselle & Sklar, LLP

(57) ABSTRACT

A light emitting device includes multiple types of solid state light emitting elements having different peak wavelengths from each other; and a wavelength converter including phosphors that convert a wavelength of light emitted from each of the solid state light emitting elements. The phosphors include two or more of a first phosphor, a second phosphor, and a third phosphor. The first phosphor is excited by light emitted from a solid state light emitting element having a relatively long peak wavelength, and the second phosphor is excited by light emitted from a solid state light emitting element having a relatively short peak wavelength. The third phosphor is excited by light emitted from any of the solid state light emitting elements.

11 Claims, 14 Drawing Sheets

○ FIRST PHOSPHOR 91 (FLUORESCENT SUBSTANCE 91a)
◉ FIRST PHOSPHOR 91 (FLUORESCENT SUBSTANCE 91b)
● SECOND PHOSPHOR 92 (FLUORESCENT SUBSTANCE 92a)
◉ SECOND PHOSPHOR 92 (FLUORESCENT SUBSTANCE 92b)

(51) Int. Cl.
    *H05B 33/12*     (2006.01)
    *H01L 33/50*     (2010.01)

(56) References Cited

U.S. PATENT DOCUMENTS

| | | | |
|---|---|---|---|
| 8,421,037 B2* | 4/2013 | Leard | 250/459.1 |
| 8,480,246 B2* | 7/2013 | Leard | 362/84 |
| 8,652,357 B2* | 2/2014 | Ryu et al. | 252/301.4 F |
| 8,663,498 B2* | 3/2014 | Masuda et al. | 252/301.4 F |
| 2007/0284563 A1 | 12/2007 | Lee et al. | |
| 2009/0002604 A1 | 1/2009 | Morimoto | |
| 2009/0224652 A1 | 9/2009 | Li et al. | |
| 2009/0262515 A1* | 10/2009 | Lee et al. | 362/84 |
| 2011/0025193 A1* | 2/2011 | Daicho et al. | 313/503 |
| 2011/0096560 A1* | 4/2011 | Ryu et al. | 362/510 |
| 2011/0102706 A1 | 5/2011 | Oshio | |
| 2011/0121758 A1 | 5/2011 | Bierhuizen et al. | |
| 2011/0204805 A1 | 8/2011 | Li et al. | |
| 2011/0211336 A1 | 9/2011 | Oshio | |
| 2012/0098460 A1 | 4/2012 | Miyasaka et al. | |
| 2012/0256222 A1* | 10/2012 | Sasaki et al. | 257/98 |
| 2013/0154510 A1* | 6/2013 | Sutardja et al. | 315/297 |

FOREIGN PATENT DOCUMENTS

| | | |
|---|---|---|
| CN | 201973648 | 9/2011 |
| CN | 102237477 | 11/2011 |
| JP | 2007-265818 | 10/2007 |
| JP | 2008-283155 | 11/2008 |
| JP | 2010-147306 | 7/2010 |
| JP | 2010-524255 | 7/2010 |
| JP | 2010-282974 | 12/2010 |
| WO | 2011/004796 | 1/2011 |

OTHER PUBLICATIONS

Extended European Search Report dated Apr. 17, 2015 issued in corresponding European application No. 13000972.3.

* cited by examiner

○ FIRST PHOSPHOR 91 (FLUORESCENT SUBSTANCE 91a)
◎ FIRST PHOSPHOR 91 (FLUORESCENT SUBSTANCE 91b)
● SECOND PHOSPHOR 92 (FLUORESCENT SUBSTANCE 92a)
◉ SECOND PHOSPHOR 92 (FLUORESCENT SUBSTANCE 92b)

[LED2a:0%, LED2b:100%]

WAVELENGTH(nm)
<5000k>

[LED2a:100%, LED2b:0%]

WAVELENGTH(nm)
<3000k>

○ FIRST PHOSPHOR 91 (FLUORESCENT SUBSTANCE 91a)
◎ FIRST PHOSPHOR 91 (FLUORESCENT SUBSTANCE 91b)
● SECOND PHOSPHOR 92 (FLUORESCENT SUBSTANCE 92a)
◉ SECOND PHOSPHOR 92 (FLUORESCENT SUBSTANCE 92b)

- ● SECOND PHOSPHOR 92 (FLUORESCENT SUBSTANCE 92a)
- ◐ SECOND PHOSPHOR 92 (FLUORESCENT SUBSTANCE 92b)
- ◉ THIRD PHOSPHOR 93 (FLUORESCENT SUBSTANCE 93a)
- ◉ THIRD PHOSPHOR 93 (FLUORESCENT SUBSTANCE 93b)

○ FIRST PHOSPHOR 91 (FLUORESCENT SUBSTANCE 91a)
◉ FIRST PHOSPHOR 91 (FLUORESCENT SUBSTANCE 91b)
● SECOND PHOSPHOR 92 (FLUORESCENT SUBSTANCE 92a)
◉ THIRD PHOSPHOR 93 (FLUORESCENT SUBSTANCE 93a)
◉ THIRD PHOSPHOR 93 (FLUORESCENT SUBSTANCE 93b)

LIGHT EMITTING DEVICE, AND ILLUMINATION APPARATUS AND SYSTEM USING SAME

FIELD OF THE INVENTION

The present invention relates to a light emitting device using a solid state light emitting element as a light source, and illumination apparatus and system using same.

BACKGROUND OF THE INVENTION

A light emitting diode (LED) can achieve high luminance emission with low power. Accordingly, it has been used as a light source for various electrical apparatuses such as a display and an illumination apparatus. Recently, in addition to a red LED and a green LED, a blue LED has been put to practical use, thus, making it possible to emit light having various colors by combining the three colors (RGB), i.e., red, green and/or blue of LEDs. Further, it is possible to arbitrarily set color temperature of the emitted light by combining an LED with a phosphor which converts a wavelength of light emitted from the LED.

Conventionally, there is known a light emitting device including a blue LED that emits blue light, a red LED that emits red light, and a sealing resin containing a plurality of phosphors which are excited by light emitted from the blue LED to emit light (see, e.g., Japanese Patent Laid-open Publication No. 2010-147306 (JP 2010-147306)). The sealing resin covers the LEDs. In the light emitting device, the plurality of phosphors have emission peak wavelengths in a wavelength range between a peak wavelength of the light emitted from the blue LED and a peak wavelength of light emitted from the red LED.

According to this configuration, light in an intermediate wavelength range between the light emitted from the blue LED and the light emitted from the red LED can be widely compensated by light emitted from the phosphors. As a result, it is possible to enhance a color rendering property of the mixed light from the light source.

In the light emitting device described in JP 2010-147306, multiple phosphors are excited by the light emitted from the blue LED having a peak wavelength on the short wavelength side of visible light to emit light. Color temperature of the light emitted from the light emitting device is changed by controlling a turn-on power of each LED. Therefore, when the turn-on power of the blue LED increases, the power of light in the intermediate wavelength range (e.g., green to orange light) emitted from the phosphors accordingly rises. Therefore, it is impossible to obtain illumination light with a sufficiently high color temperature. Consequently, a variable range of the color temperature becomes narrow.

Further, while the color temperature can be adjusted by controlling the turn-on power of the red LED in a relatively low color temperature range, it is difficult to adjust the color temperature by controlling the turn-on power of the blue LED in a relatively high color temperature range. As a result, it is difficult to smoothly vary the color temperature of the illumination light.

SUMMARY OF THE INVENTION

In view of the above, the present invention provides a light emitting device having a wide variable range of a color temperature of illumination light and capable of smoothly varying the color temperature of the illumination light, and an illumination apparatus using the same.

In accordance with a first aspect of the present invention, there is provided a light emitting device including: multiple types of solid state light emitting elements having different peak wavelengths from each other; and a wavelength converter including phosphors that convert a wavelength of light emitted from each of the solid state light emitting elements, wherein the wavelength converter is disposed to cover the solid state light emitting elements, and wherein the phosphors include two or more of a first phosphor, a second phosphor, and a third phosphor, the first phosphor being excited by light emitted from a solid state light emitting element having a peak wavelength on a relatively long wavelength side among the multiple of types of solid state light emitting elements, the second phosphor being excited by light emitted from a solid state light emitting element having a peak wavelength on a relatively short wavelength side among the multiple types of solid state light emitting elements, the third phosphor being excited by light emitted from any of the multiple types of solid state light emitting elements.

The first phosphor, the second phosphor or the third phosphor may include a plurality of fluorescent substances that have a same excitation wavelength and different peak wavelengths from each other.

The wavelength converter preferably includes a first layer made of a sealing resin containing the phosphor that has an excitation wavelength on a relatively long wavelength side among the first phosphor, the second phosphor and the third phosphor, and a second layer made of a sealing resin containing the phosphor that has an excitation wavelength on a relatively short wavelength side than that of the phosphor contained in the sealing resin of the first layer. Further, the first layer may be disposed to cover the solid state light emitting elements, and the second layer is disposed on the first layer.

The multiple types of solid state light emitting elements may include at least one first solid state light emitting element having a peak wavelength on a relatively long wavelength side, and at least one second solid state light emitting element having a peak wavelength on a relatively short wavelength side.

The first phosphor may scatter light emitted from the second solid state light emitting element, and the second phosphor may scatter light emitted from the first solid state light emitting element.

It is preferred that the first solid state light emitting element and the second solid state light emitting element are arranged alternately such that one is adjacent to the other.

In the light emitting device, a group of the first solid state light emitting element and a group of the second solid state light emitting element may be separately arranged on a group basis.

In accordance with a second aspect of the present invention, there is provided an illumination apparatus including the above-described light emitting device, and a controller which controls a turn-on power of each of the multiple types of solid state light emitting elements to vary a color temperature of mixed light which is obtained by mixing lights emitted from the solid state light emitting elements.

The controller may change the color temperature of the mixed light by varying the turn-on powers of both of the first type light emitting element and the second type light emitting element.

Alternatively, the controller may change the color temperature of the mixed light by varying the turn-on power of one of the first type light emitting element and the second type light emitting element while fixing the turn-on power of the other to a predetermined value.

In accordance with a third aspect of the present invention, there is provided an illumination system including the above-described light emitting device or the illumination apparatus. In case of including the light emitting device, the illumination system may further include a controller which controls a turn-on power of each of the multiple types of solid state light emitting elements to vary a color temperature of mixed light which is obtained by mixing lights emitted from the solid state light emitting elements.

According to the present invention, it is possible to widen the variable range of the color temperature by controlling the turn-on powers of multiple types of solid state light emitting elements. In addition, the wavelength converter includes at least two out of the first phosphor, the second phosphor, and the third phosphor, which are excited by each of multiple types of solid state light emitting elements to emit light, thereby compensating for the color of light in the intermediate wavelength range. Thus, it is possible to smoothly vary the color temperature of the illumination light.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, a light emitting device, and an illumination apparatus and system using the same in accordance with an embodiment of the present invention will be described with reference to the accompanying drawings which form a part hereof.

Figure 1:
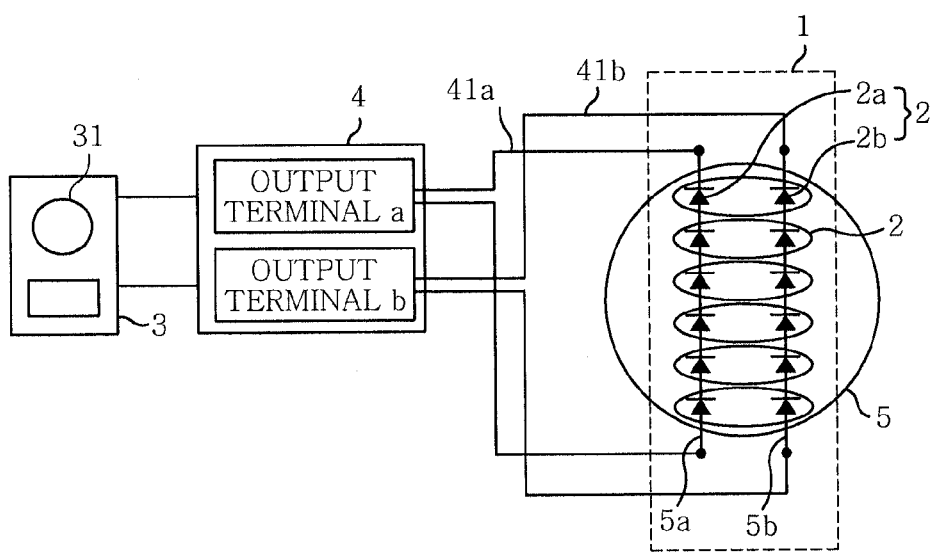
FIG. 1 is a schematic diagram showing a configuration of an illumination apparatus including a light emitting device in accordance with an embodiment of the present invention.

FIG. 1 shows a schematic configuration of an illumination system 100 including a light emitting device 1 in accordance with an embodiment of the present invention. As shown in FIG. 1, the illumination system 100 includes the light emitting device 1 having a plurality of light emitting diodes (hereinafter, referred to as LEDs) as a light source, a color temperature setting unit 3 used in setting color temperature to a predetermined value, and a controller 4 which controls the light source 2 to output light with a color temperature set by the color temperature setting unit 3.

The light source 2 of the light emitting device 1 includes multiple types (two types in this example) of LEDs 2a and 2b. The LEDs 2a and 2b have different peak wavelengths at which spectral radiant intensity of the emitted light is maximized. The light source 2 is mounted on a substrate 5 as packages each including at least one LED 2a and at least one LED 2b. Further, wired circuits 5a and 5b are formed on the substrate 5 to connect the LEDs 2a and 2b such that the same types of LEDs are connected in series.

In this case, the LED 2a (first solid state light emitting element) is an element having a peak wavelength of the emitted light on the relatively long wavelength side, and the LED 2b (second solid state light emitting element) is an element having a peak wavelength of the emitted light on the relatively short wavelength side.

The color temperature setting unit 3 includes a volume controller 31 for setting color temperature of the mixed light obtained by mixing lights emitted from the LEDs 2a and 2b, i.e., the illumination light of the light emitting device 1, to a predetermined value. When a user rotates the volume controller 31, the light emitting device 1 is turned on and then the light power of the light emitting device 1 is changed with a rotational amount of the volume controller 31. For example, light with a high color temperature is irradiated while the light power is small after the light emitting device 1 is turned on. When the volume controller 31 is further rotated, the color temperature of the light changes gradually to a low color temperature from a high color temperature at the same time as the light power from the light emitting device 1 increases. The color temperature setting unit 3 is provided in the form of an operation unit attached to the wall or a remote controller and is operated by the user. When the user operates it, the color temperature setting unit 3 transmits accordingly an operation signal to the controller 4 in a wired or wireless manner.

The controller 4 includes a plurality of output terminals (output terminals a and b in the illustrated example) corresponding to the types of the packages consisting of the light sources 2. The controller 4 may be incorporated in a power supply unit (not shown) for supplying power to the light emitting device 1. Further, the controller 4 has a rectifier transformer circuit (not shown) which receives power supplied from a commercial power source (not shown) and converts it into a predetermined DC current. The controller 4 controls a voltage applied to each of the LEDs 2a and 2b based on a duty signal inputted from the color temperature setting unit 3, the duty signal including control information on a set color temperature. The output terminals a and b are connected to the wired circuits 5a and 5b via wirings 41a and 41b, respectively.

Figure 2A:
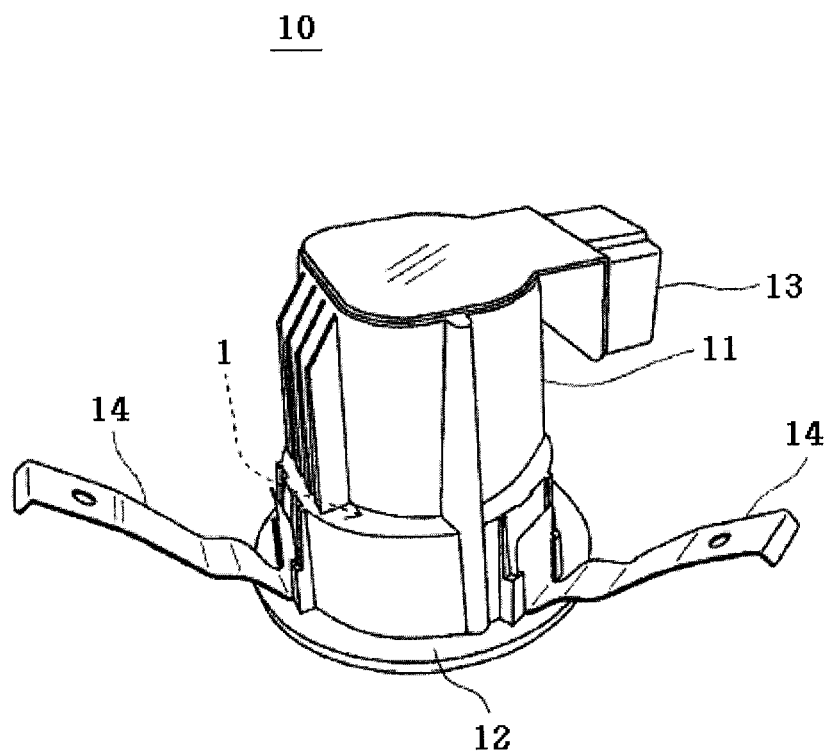
FIG. 2A is an external perspective view of an illumination system including the light emitting device in accordance with the embodiment of the present invention.

FIG. 2A shows an external appearance of the embedded type illumination system 10 which is embedded in the ceiling, wall, and the like. The illumination system 10 includes a main body 11 which accommodates the power supply unit (not shown) and the light emitting device 1. The controller 4 for controlling the lighting of the light emitting device 1 is incorporated in the power supply unit. The illumination system 10 further includes a frame body 12 which is fitted into an opening formed in the ceiling and the like to hold the light source and the like, and a terminal block 13 connected to a power supply line to receive the power from the commercial power source. The frame body 12 is fixed to the ceiling and the like with an installing spring 14.

Figure 2B:
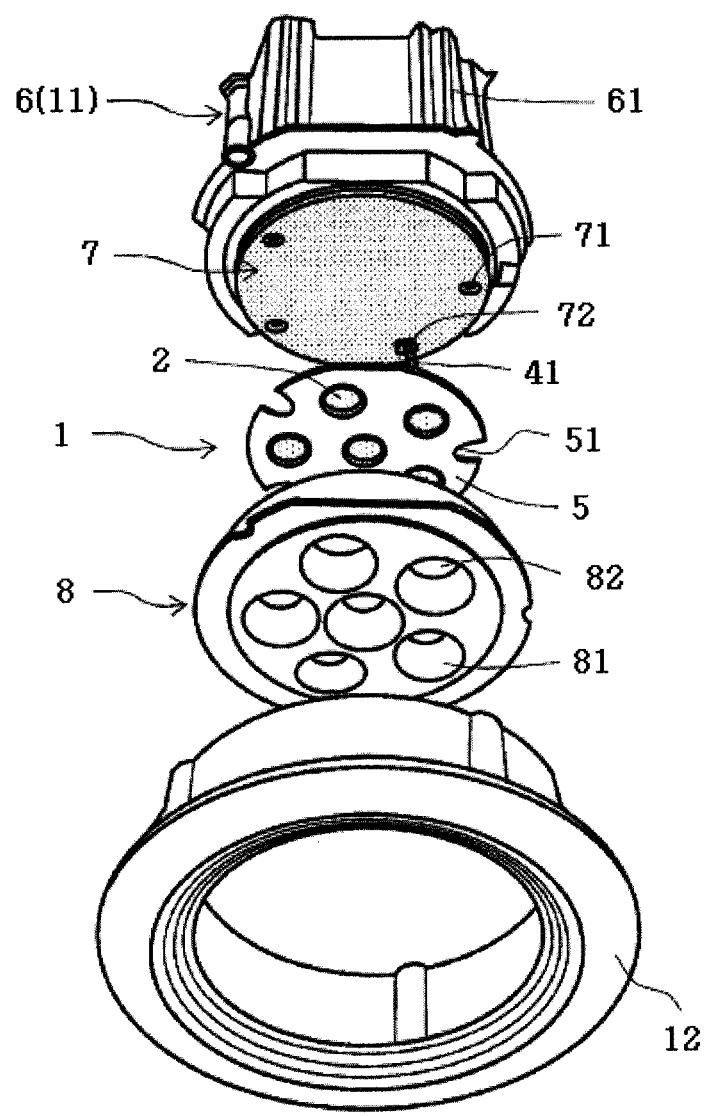
FIG. 2B is an exploded perspective view thereof.

As shown in FIG. 2B, the illumination system 10 includes the substrate 5, a heat sink 6 for dissipating heat from the light source 2, a supporting member 7 provided between the substrate 5 and the heat sink 6, and a protective cover 8 for protecting the light source 2. On the back side of the protective cover 8, screw holes (not shown) are provided, so that screws (not shown) may be inserted to pass through the screw holes from the inside of the heat sink 6 (main body 11) to the protective cover 8, thereby fixing the protective cover 8 to the heat sink 6.

The substrate 5 is a generic substrate for a light emitting module, and made of a material having an electrical insulating property, e.g., metal, metal nitride such as aluminum nitride (AlN), metal oxide (including ceramic) such as aluminum oxide ($Al_2O_3$), resin, or glass fibers. The substrate 5 has a planar outer shape corresponding to the inner shape of the main body 11, e.g., a substantially circular shape. The substrate 5 has notch holes 51, which are formed in the periphery of the substrate 5, for attaching to the heat sink 6.

Further, the substrate 5 has openings which are formed to be opened to the protective cover side. The light source 2 are bonded to the openings and exposed from the corresponding openings of the protective cover 8. Furthermore, a conductive pattern (not shown) serving as the wired circuits 5a and 5b is formed in the substrate, and each LED of the light source 2 is connected to the conductive pattern. The conductive pattern is connected to the power supply unit accommodated in the main body 11 through the wirings 41a and 41b. The wirings 41a and 41b are inserted into through holes (not shown) provided in the substrate 5, and electrically connected to the conductive pattern.

The heat sink 6 is made of, e.g., an aluminum alloy or the like, and is formed integrally with the main body 11 or as a part of the main body 11 by preferably using a general-purpose aluminum die-cast. On the surface of the heat sink 6 facing the supporting member 7, fixing holes (not shown) for inserting fixing members such as screws for fixing the substrate 5, or through holes (not shown) for inserting the wirings 41a and 41b into the main body 11 are formed. Further, heat radiation fins 61 are formed in the heat sink 6 to increase the surface area in contact with the ambient air, thereby improving heat dissipation.

The supporting member 7 is formed of a resin material having a high thermal conductivity as well as an insulating property. Preferably, the resin material has a withstanding insulation voltage of about 4 kV, and a thermal conductivity of 5 W/mk to 10 W/mk. Further, the resin material may contain appropriate fillers. Accordingly, it is possible to arbitrarily control the thermal conductivity and the insulating property of the supporting member 7 by adjusting the type and the addition of the filler. Thus, the resin material may include, for example, ABS resin, PBT resin, or the like containing ceramic particles or the like, as the filler.

Further, particles of metal oxide such as aluminum oxide ($Al_2O_3$), titanium oxide ($TiO_2$), or aluminum nitride (AlN) having a high thermal conductivity as well as an insulating property may be used as the filler. Preferably, the resin material used for the supporting member 7 has a sticky gel (adhesive property) on the surface thereof, and has a good cushion, i.e., a low rigidity. Further, the supporting member 7 has fixing holes 71 for inserting fixing members such as screws for fixing the substrate 5 to the heat sink 6, and through holes 72 for inserting the wirings 41a and 41b in the main body 11, in positions corresponding to the fixing holes and the through holes (not shown) of the heat sink 6, respectively.

The protective cover 8 is injection molded in a bottomed cylindrical shape by using a light transmissive material such as transparent acrylic. The protective cover 8 has a plurality of openings 81 provided to correspond to installation positions of the light sources 2. Lenses 82 are inserted in the openings 81 to distribute lights from the light sources 2. The lenses 82 may be formed integrally with the protective cover 8. The inner peripheral surfaces of the openings 81 may be formed as reflective surfaces. Preferably, surface texturing is performed on a lower surface of the protective cover 8, i.e., the surface facing the substrate 5. This may make the internal structure including the light emitting device 1, the substrate 5, and the like, hardly visible from the outside.

Figure 3:
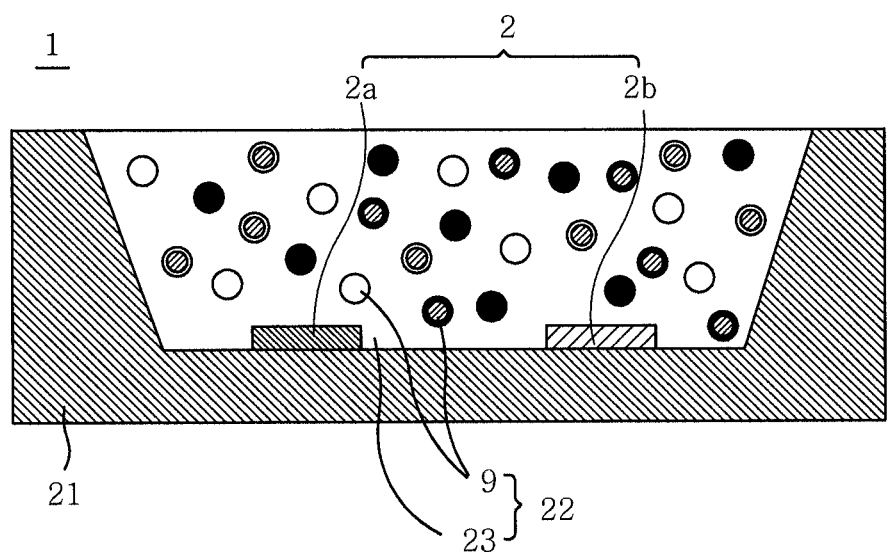
FIG. 3 is a transverse cross-sectional view of a main part in a first configuration example of the light emitting device according to the present invention.

As shown in FIG. 3, the light emitting device 1 includes the LEDs 2a and 2b serving as the light source 2, a recessed frame part 21 having a mounting surface of the LEDs 2a and 2b at the bottom thereof and surrounding the LEDs 2a and 2b, and a wavelength converter 22 including phosphors 9 that converts the wavelength of the light emitted from the LEDs 2a and 2b. The wavelength converter 22 is formed by filling a sealing resin 23 made of transparent resin such as silicone resin containing the phosphors 9 in the frame part 21. That is, the wavelength converter 22 is provided to cover both the LEDs 2a and 2b, and functions as a sealing member of the LEDs 2a and 2b while converting the wavelength of the light emitted from the LEDs 2a and 2b.

A general-purpose compound semiconductor or the like is used for the LEDs 2a and 2b. Wavelengths of the lights emitted from the LEDs 2a and 2b are arbitrary, but it is preferable that the peak wavelength thereof falls within a wavelength range of 350 to 470 nm. In order to increase the accuracy in controlling the emission of the phosphors 9 by the light emitted from the LEDs 2a and 2b, it is preferable that a difference between peak wavelengths of lights emitted from the LEDs 2a and 2b is large, and more preferably, 40 nm or more.

Figure 4:
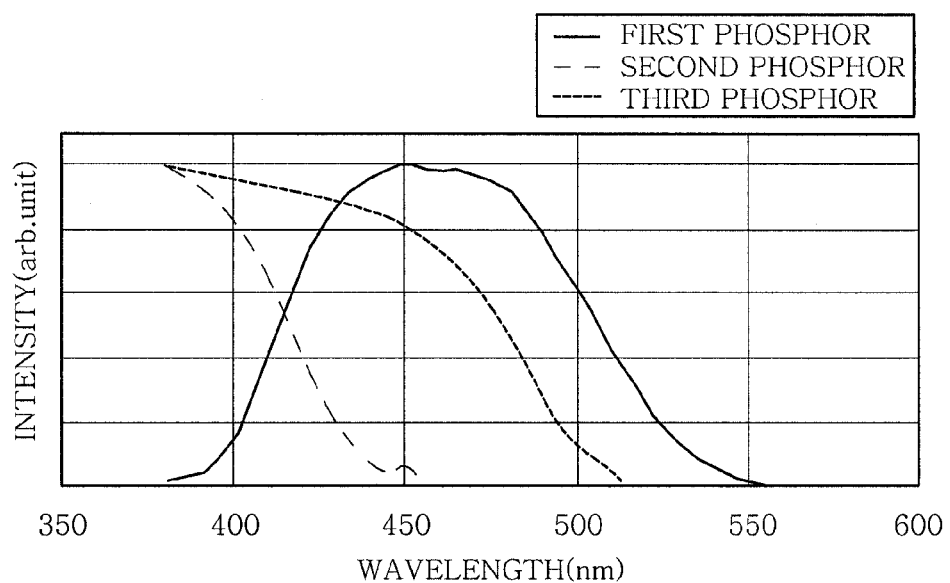
FIG. 4 shows excitation wavelength characteristics of phosphors used in the light emitting device according to the present invention.

The phosphors 9 include at least two of three types: a first phosphor 91 which is excited by light emitted from the LED 2a having a peak wavelength on the long wavelength side, a second phosphor 92 which is excited by light emitted from the LED 2b having a peak wavelength on the short wavelength side, and a third phosphor 93 which is excited by light emitted from both of the LEDs 2a and 2b. FIG. 4 shows an example of excitation wavelengths of the first phosphor 91, the second phosphors 92 and the third phosphor 93 when the peak wavelength of the light emitted from the LED 2a is 450 nm, and the peak wavelength of the light emitted from the LED 2b is 400 nm.

The phosphors 9 may include two of the three types, e.g., the first phosphor 91 and the second phosphor 92, the second phosphor 92 and the third phosphor 93, or the first phosphor 91 and the third phosphor 93. Alternatively, the phosphors 9 may include all the three types of phosphors 91, 91, and 93.

The first phosphor 91 includes fluorescent substances 91a and 91b which have a common excitation wavelength and have different peak wavelengths from each other. Similarly, the second phosphor 92 includes fluorescent substances 92a and 92b which have a common excitation wavelength and different peak wavelengths from each other, and the third phosphor 93 includes fluorescent substance 93a and 93b (see FIG. 9 to be described later) which have a common excitation wavelength and different peak wavelengths from each other.

Three configuration examples of the light emitting device 1 will be described below. In a first configuration example, the phosphors 9 include the first phosphor 91 (fluorescent substances 91a and 91b) and the second phosphor (fluorescent substances 92a and 92b). In a second configuration example, the phosphors 9 include the second phosphor 92 (fluorescent substances 92a and 92b) and the third phosphor 93 (fluorescent substances 93a and 93b). In a third configuration example, the phosphors 9 include the first phosphor 91 (fluorescent substances 91a and 91b) and the third phosphor 93 (fluorescent substances 93a and 93b).

(First Configuration Example)

FIGS. 3 and 5A to 6B show the first configuration example of the light emitting device 1. In this case, a blue LED that emits blue light having a peak wavelength of 450 nm is used as the LED 2a (first solid state light emitting element), and a violet LED that emits violet light having a peak wavelength of 400 nm is used as the LED 2b (second solid state light emitting element). Then, as the fluorescent substances 91a and 91b of the first phosphor 91, a CSO phosphor (e.g., $CaSc_2O_4Ce$) and a CaS phosphor are used respectively. The fluorescent substances 91a and 91b have the excitation wavelength of around 450 nm, and emit green light and orange to red light, respectively.

As the fluorescent substances 92a and 92b of the second phosphor 92, a BAM:Eu, Mn phosphor and a LOS phosphor (e.g., $LaO_2S$: Eu) are used respectively. The fluorescent substances 92a and 92b have the excitation wavelength of around 400 nm, and emit blue light and red light, respectively. The lights emitted from the fluorescent substances 91a, 91b, 92a, and 92b may have multiple peak wavelengths on the spectral spectrum thereof. Herein, a color of light with the maximum peak wavelength represents the color of light emitted from the corresponding fluorescent substance. Further, the above-mentioned phosphors are exemplary, and other phosphors having the same wavelength conversion characteristics may be used. The same applies to the phosphors which will be later described.

According to the above configuration, the LEDs 2a and 2b emit lights having the peak wavelengths on the short wavelength side of a visible light range. Each fluorescent substance is excited by the light emitted from the LEDs 2a and 2b, and emits light having peak wavelengths on the long wavelength side of the visible light range. In the first to third configuration examples, it is assumed that the fluorescent substances 92a and 92b have high wavelength conversion efficiency and convert most light in a wavelength range around 400 nm into light of a different wavelength range.

The concentration of the fluorescent substances 91a and 91b to the sealing resin 23 is adjusted appropriately according to a variable range in the color temperature of the illumination light from the light emitting device 1. For example, in the first configuration example shown in FIG. 3, the concentration of the fluorescent substances 91a and 91b is set to be lower than that of the fluorescent substances 92a and 92b. The concentration of the fluorescent substance 91b which emits orange to red light is adjusted to be relatively higher than that of the fluorescent substance 91a. Further, the concentration of the fluorescent substance 92a is adjusted to be relatively lower than that of the fluorescent substance 92b.

Figure 5A:
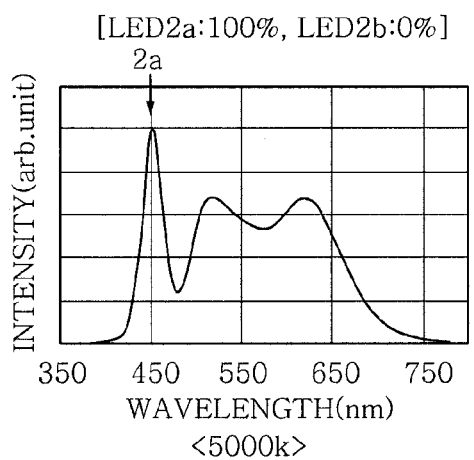
FIGS. 5A and 5B are diagrams showing the spectral spectrum of light emitted from the light emitting device according to the first configuration example.

For example, it is assumed that the controller 4 has controlled the ON duty of the LED 2a and 2b to 100% and 0%, respectively. FIG. 5A shows the spectral spectrum of white light obtained by mixing light emitted from the LED 2a and lights converted by the fluorescent substances 91a and 91b at this time. In this example, since the concentration of the fluorescent substances 91a and 91b is low, a part of the blue light emitted from the LED 2a is radiated without being converted by the fluorescent substances 91a and 91b. The peak wavelength of the light emitted from the LED 2a is indicated by "2a" in FIG. 5A. Further, the blue light is mixed with green light and orange to red light converted by the fluorescent substances 91a and 91b. As a result, since the radiant intensity of blue light is relatively strong, it is possible to obtain illumination light having a relatively high color temperature of 5000 K.

Figure 5B:
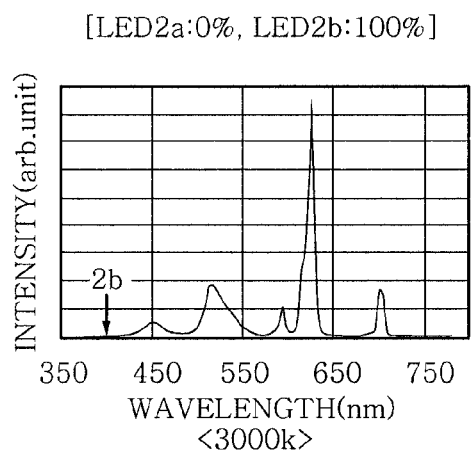

Next, it is assumed that the controller 4 has controlled the ON duty of the LED 2a and 2b to 0% and 100%, respectively. FIG. 5B shows the spectral spectrum of white light obtained by mixing light emitted from the LED 2b and lights converted by the fluorescent substances 92a and 92b having a relatively high concentration at this time. In this example, since the fluorescent substances 92a and 92b have high conversion efficiency as well as high concentration, most of the violet light emitted from the LED 2b is converted by the fluorescent substances 92a and 92b, and violet light is hardly radiated. Thus, the blue light and red light converted by the fluorescent substances 92a and 92b are mixed. Further, since the concentration of the fluorescent substance 92b is higher than that of the fluorescent substance 92a, the radiant intensity of the red light is relatively strong, and it is possible to obtain illumination light having a relatively low color temperature of 3000 K.

In the forgoing description on the spectral spectrums, the illumination light with a high color temperature is obtained based on the light emitted from the LED 2a, and the illumination light with a low color temperature is obtained based on the light emitted from the LED 2b. However, the present invention is not limited to the combination of the phosphors as described above. For example, unlike the phosphors used in obtaining the spectral spectrum shown in FIG. 5B, the concentration of the fluorescent substance 92a may be set to be higher than that of the fluorescent substance 92b.

Figure 6A:
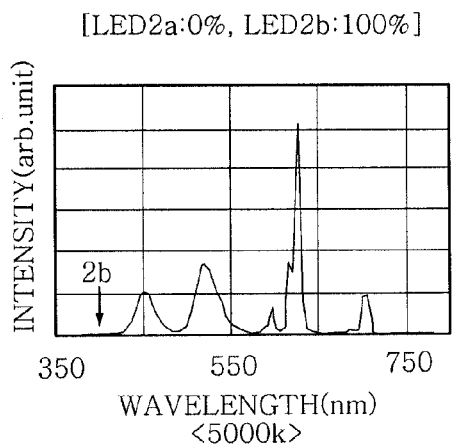
FIGS. 6A and 6B are diagrams showing the spectral spectrum of light emitted from the light emitting device according to another example of the first configuration example.

Then, it is assumed that the controller 4 has controlled the ON duty of the LED 2a and 2b to 0% and 100%, respectively. FIG. 6A shows the spectral spectrum of white light obtained by mixing light emitted from the LED 2b and lights converted by the fluorescent substances 92a and 92b at this time. In this example, since the fluorescent substances 92a and 92b have high conversion efficiency, most of the violet light emitted from the LED 2b is converted and the violet light is hardly radiated. Further, since the concentration of the fluorescent substance 92a is relatively high, the radiant intensity of the blue light is relatively strong in the light obtained by mixing the blue light and red light converted by the fluorescent substances 92a and 92b. Thus, the illumination light having a relatively high color temperature of 5000 K can be obtained.

Figure 6B:
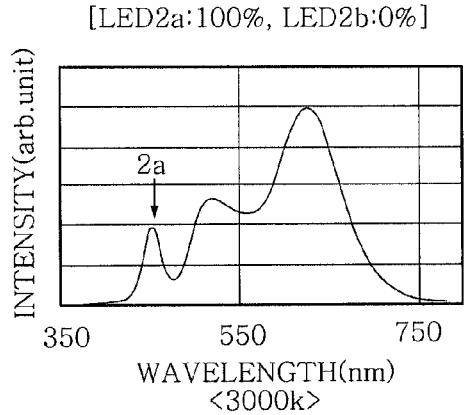

For example, unlike the phosphors used in obtaining the spectral spectrum shown in FIG. 5A, the fluorescent substances 91a and 91b may have a higher concentration than that of the fluorescent substances 92a and 92b, and particularly, the concentration of the fluorescent substance 91b may be set to be higher than that of the fluorescent substance 91a. Then, it is assumed that the controller 4 has controlled the ON duty of the LED 2a and 2b to 100% and 0%, respectively. FIG. 6B shows the spectral spectrum of white light obtained by mixing light emitted from the LED 2a and lights converted by the fluorescent substances 91a and 91b at this time. In this example, since the concentration of the fluorescent substances 91a and 91b is high, a larger amount of the blue light emitted from the LED 2a is converted as compared to the case of FIG. 5A.

Then, the green light and the orange to red light converted by the fluorescent substances 91a and 91b and the light emitted from the LED 2a are mixed. Since the concentration of the fluorescent substance 91b is higher than that of the fluorescent substance 91a, the radiant intensity of the orange to red light is relatively strong, and it is possible to obtain the illumination light having a relatively low color temperature of 3000 K. Thus, the light emitting device 1 can irradiate light with an arbitrary color temperature by appropriately setting the types of the LEDs 2a and 2b, and the types and concentrations of the fluorescent substances. Additionally, it is possible to widen the variable range of the color temperature by controlling the turn-on power of two types of the LEDs 2a and 2b.

Further, the second phosphor 92 excited by light emitted from the LED 2b is hardly excited by the light emitted from the LED 2a, and functions as a scattering material to scatter the light emitted from the LED 2a. Similarly, the first phosphor 91 functions as a scattering material to scatter the light emitted from the LED 2b. As a result, the lights emitted from the LEDs 2a and 2b and the lights converted by the phosphors 91 and 92 are scattered in the wavelength converter 22 and radiated to the outside. Therefore, the light emitting device 1 according to the present invention can irradiate the mixed light with less color unevenness.

The controller 4 changes the color temperature of the light emitted from the light emitting device 1 by varying the turn-on power of each of the LEDs 2a and 2b serving as the light source 2 of the light emitting device 1 configured as such. For example, in the case of using the light emitting device 1 in which the illumination light has the spectral spectrum as shown in FIGS. 5A and 5B, if the ON duty of the LED 2a is 100% and the ON duty of the LED 2b is 0%, it is possible to obtain the illumination light having a high color temperature of 5000 K. Further, by gradually decreasing the turn-on power of the LED 2a and increasing the turn-on power of the LED 2b, it is possible to smoothly reduce the color temperature of the illumination light. Then, if the ON duty of the LED 2a becomes 0% and the ON duty of the LED 2b becomes 100%, it is possible to obtain the illumination light having a color temperature of 3000 K.

Figure 7:
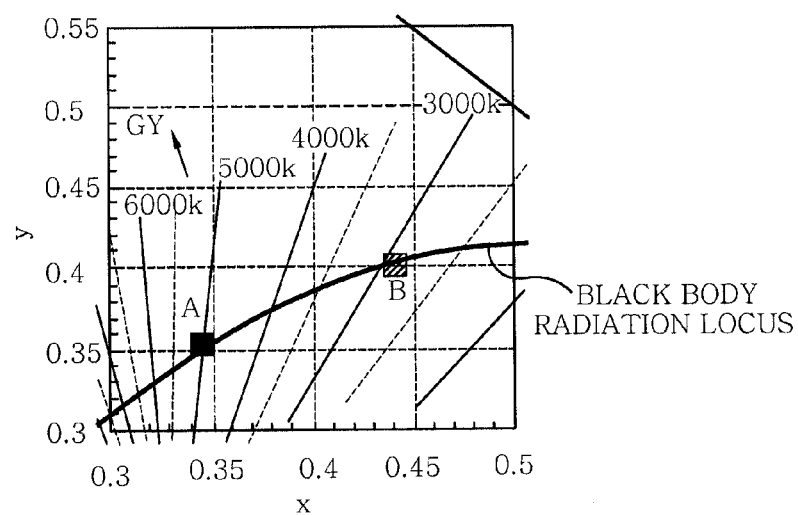
FIG. 7 is a chromaticity diagram showing a variation range of the color temperature and the chromaticity of illumination light of the light emitting device according to the present invention.

As the above, by controlling the turn-on power of each of the LEDs 2a and 2b, the color temperature can be varied between 5000 K ("A" in the figure) and 3000 K ("B" in the figure) as shown in FIG. 7. Further, the first phosphor 91 (fluorescent substances 91a and 91b) that is excited by the LED 2a to emit light and the second phosphor 92 (fluorescent substances 92a and 92b) that is excited by the LED 2b to emit light compensate for green to red light in the intermediate wavelength range. Therefore, it is possible to smoothly vary the color temperature of the illumination light from a high color temperature to a low color temperature and vice versa. Even in the case of using the light emitting device 1 that emits the illumination light having the spectral spectrum as shown in FIGS. 6A and 6B, the same color temperature control can be achieved.

Figure 8:
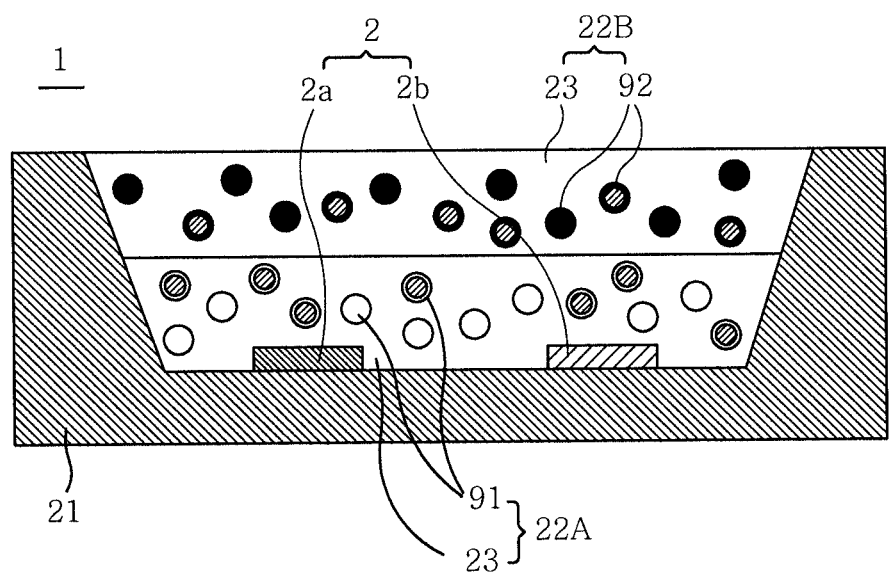
FIG. 8 is a transverse cross-sectional view of the light emitting device having a modified wavelength converter in the first configuration example.

A modification example of the above embodiment will be described with reference to FIG. 8. In the modification example, the wavelength converter 22 includes, as a first layer 22A, the sealing resin 23 containing the first phosphor 91 having an excitation wavelength on the relatively long wavelength side, and, as a second layer 22B, the sealing resin 23 containing the second phosphor 92 having an excitation wavelength on the relatively short wavelength side compared to the first layer 22A. The first layer 22A covers at least a portion of the LEDs 2a and 2b, and the second layer 22B is provided on the first layer 22A.

The light emitted from the LED 2b having a peak wavelength on the short wavelength side may be converted by the second phosphor 92, and then re-converted by the first phosphor 91. Such re-conversion may reduce the utilization efficiency of the light emitted from the LED 2b. Accordingly, the illumination light with a desired color temperature may not be obtained, or it may cause a decrease in brightness. With this modification example, the second phosphor 92 is provided at a position farther than the first phosphor 91 from the LEDs 2a and 2b in the radiation direction of the light from the LEDs 2a and 2b. Therefore, the light emitted from the LED 2b and converted by the second phosphor 92 is directly radiated to the outside, and it is difficult to be re-converted by the first phosphor 91. As a result, it is possible to suppress a decrease in utilization efficiency of the light emitted from the LED 2b, and to obtain the illumination light with a desired color temperature.

(Second Configuration Example)

Figure 9:
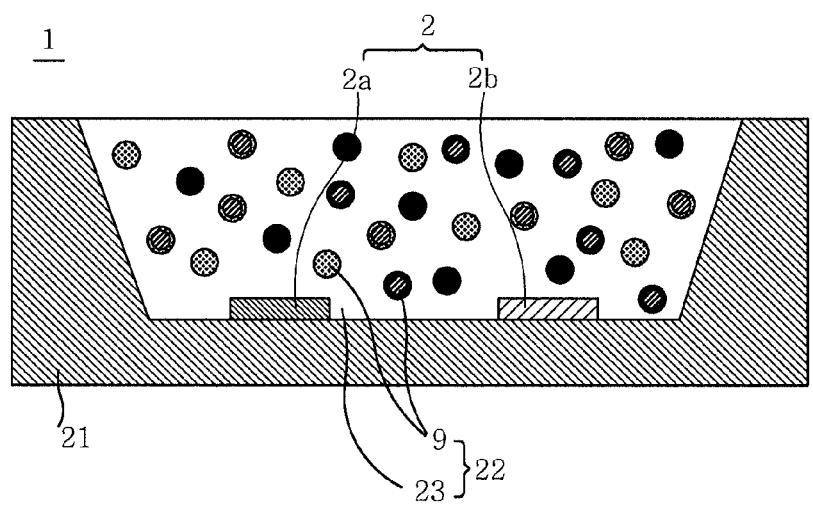
FIG. 9 is a transverse cross-sectional view of a main part in a second configuration example of the light emitting device according to the present invention.
Figure 10A:
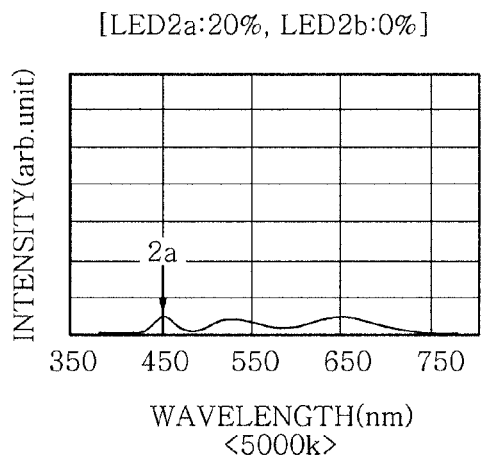
FIGS. 10A and 10B are diagrams showing the spectral spectrum of light emitted from the light emitting device according to the second configuration example.
Figure 10B:
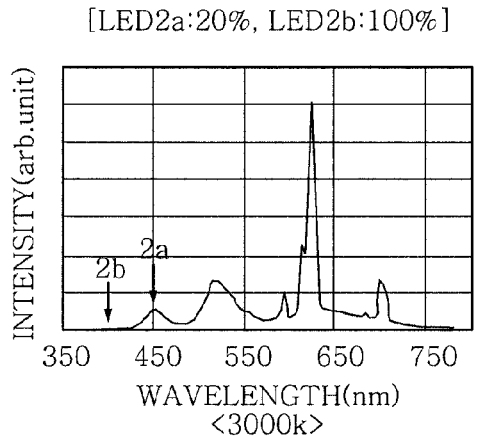

Next, a second configuration example of the light emitting device 1 will be described with reference to FIGS. 9 to 10B. As in the first configuration example, a blue LED that emits blue light having a peak wavelength of 450 nm is used as the LED 2a (first solid state light emitting element), and a violet LED that emits violet light having a peak wavelength of 400 nm is used as the LED 2b (second solid state light emitting element). Then, as the fluorescent substances 93a and 93b of the third phosphor 93, a BOSE phosphor (e.g., $(Ba, Sr)_2SiO_4$:Eu) and a CASN phosphor (e.g., $CaAlSiN_3$:Eu) are used respectively.

The fluorescent substances 93a and 93b have a wide excitation wavelength range of 400 to 450 nm, and emit green and orange to red lights, respectively. As the fluorescent substances 92a and 92b of the second phosphor 92, like the first configuration example, a BAM:Eu, Mn phosphor and a LOS phosphor (e.g., $LaO_2S$: Eu) are used respectively. In this example, the concentration of the fluorescent substances of the second phosphor 92 is set to be relatively higher than that of the fluorescent substances of the third phosphor 93.

Then, it is assumed that the controller 4 has controlled the ON duty of the LED 2a to 20% and the ON duty of the LED 2b to 0%. FIG. 10A shows the spectral spectrum of white light obtained by mixing lights converted by the fluorescent substances 93a and 93b and light emitted from the LED 2a at this time. The light emitted from the LED 2a is only partially converted by the third phosphor 93 (fluorescent substances 93a and 93b). Accordingly, the blue light emitted from the LED 2a is mixed with green light and red light converted by the fluorescent substances 93a and 93b. As a result, the radiant intensity of blue light is relatively strong, and it is possible to obtain illumination light having a relatively high color temperature of 5000 K.

On the other hand, it is assumed that the controller 4 controls the ON duty of the LED 2a to 20% and the ON duty of the LED 2b to 100%. FIG. 10B shows the spectral spectrum of white light obtained by mixing lights converted by the fluorescent substances 92a and 92b and the fluorescent substances 93a and 93b and light emitted from the LEDs 2a and 2b at this time. In this example, since the conversion efficiency of the fluorescent substances 92a and 92b is high and the concentration thereof is also high, most of the violet light emitted from the LED 2b is converted, and the violet light emitted from the LED 2b is hardly radiated. Accordingly, the blue light from the LED 2a is mixed with blue to red light converted by the fluorescent substances 92a and 92b and the fluorescent substances 93a and 93b. As a result, the radiant intensity of the red light is relatively strong, and it is possible to obtain illumination light having a relatively low color temperature of 3000 K.

In the second configuration example as described above, the turn-on power of the LED 2b is varied while the LED 2a is being lit with a predetermined value (e.g., ON duty of 20% in this example), thereby changing the color temperature of the illumination light from the light emitting device 1. In this way, the turn-on power of the LEDs 2a and 2b varies depending on a change in the color temperature of the illumination light. Specifically, as the color temperature decreases from 5000 K to 3000 K, the total turn-on power of the LEDs 2a and 2b increases from 20% to 120%. In other words, it is possible to irradiate light with a high color temperature at a low power, and light with a low color temperature at a high power.

In general, it is known that an object or the like is visible vividly to human eyes even at a long distance by light with a high color temperature, i.e., bluish light in a dark place, and visible vividly to human eyes by light with a low color temperature, i.e., reddish light in a bright place. This visual phenomenon is called Purkinje's phenomenon, and for example, is applied to a streetlight. Thus, by using bluish light when there is less pedestrian traffic, e.g., when it is late at night, it is possible to enhance visibility at a low illumination level, thereby achieving efficient lighting for crime prevention at a low power.

Further, when there is high pedestrian traffic, e.g., after dusk, it is possible to create a vibrant lighting space by lowering the color temperature at a high illumination level. In the second configuration example of the light emitting device 1 according to the present invention, since light with a high color temperature is irradiated at a low power, and light with a low color temperature is irradiated at a high power, it can be applied to the streetlight utilizing Purkinje's phenomenon.

In the second configuration example of the light emitting device 1, although the third phosphor 93 has a wide excitation wavelength range, the wavelength conversion efficiency thereof is relatively low, and a blue light component mainly depends on the light emitted from the LED 2a. Accordingly, when the turn-on power of the LED 2a becomes greater than 20% described in the second configuration example, the radiant intensity of the blue light may be much stronger than that of other colors of light. However, obvious blue light may be advantageously used as illumination light of the streetlight utilizing Purkinje's phenomenon. Consequently, the second configuration example of the light emitting device 1 can be used suitably as long as the use of white light is not needed in the installation environment of an illumination apparatus 100.

(Third Configuration Example)

Figure 11:
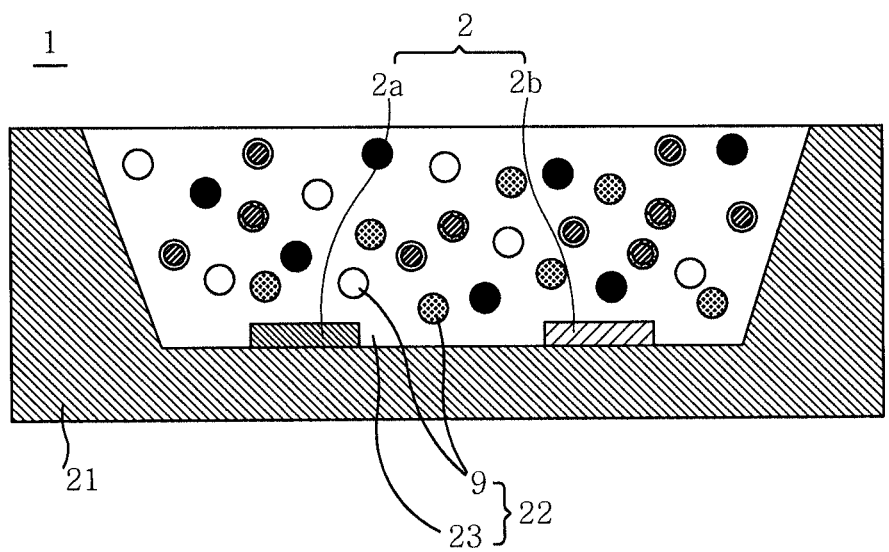
FIG. 11 is a transverse cross-sectional view of a main part in a third configuration example of the light emitting device according to the present invention.
Figure 12A:
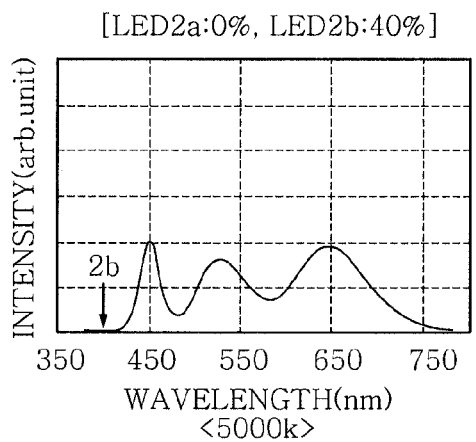
FIGS. 12A and 12B are diagrams showing the spectral spectrum of light emitted from the light emitting device according to the third configuration example.
Figure 12B:
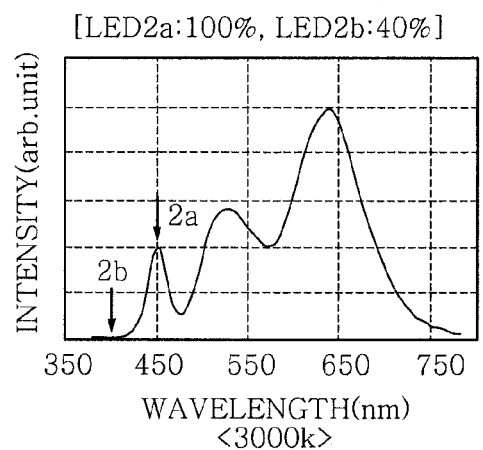

Next, a third configuration example of the light emitting device 1 will be described with reference to FIGS. 11 to 12B. Similar to the above, a blue LED that emits blue light having a peak wavelength of 450 nm is used as the LED 2a (first solid state light emitting element), and a violet LED that emits violet light having a peak wavelength of 400 nm is used as the LED 2b (second solid state light emitting element). A halophosphate phosphor is used as the fluorescent substance 92a of the second phosphor 92. The fluorescent substance 92a has an excitation wavelength of 400 nm, and emits blue light. As the fluorescent substances 91a and 91b of the first phosphor 91, a CSO phosphor (e.g., $CaSc_2O_4Ce$) and a CaS phosphor in the first configuration example are used respectively.

As the fluorescent substances 93a and 93b of the third phosphor 93, a BOSE phosphor (e.g., $(Ba, Sr)_2SiO_4:Eu$) and a CASN phosphor (e.g., $CaAlSiN_3:Eu$) in the second configuration example are used respectively. In the third configuration example, the concentrations of the fluorescent substance 92a (blue light emission) and the fluorescent substance 91b (red light emission) are relatively higher than that of other fluorescent substances.

It is assumed that the controller 4 has controlled the ON duty of the LED 2b to 40% and the ON duty of the LED 2a to 0%. FIG. 12A shows the spectral spectrum of white light obtained by mixing lights converted by the fluorescent substances 92a, 93a and 93b at this time. The light emitted from the LED 2b is converted by the second phosphor 92 (fluorescent substance 92a) and the third phosphor 93 (fluorescent substances 93a and 93b). In this example, since the concentration of the second phosphor 92 (fluorescent substance 92a) is high, the radiant intensity of blue light becomes relatively high. As a result, the radiant intensity of blue light is relatively strong, and it is possible to obtain illumination light having a relatively high color temperature of 5000 K.

It is assumed that the controller 4 has controlled the ON duty of the LED 2b to 40% and the ON duty of the LED 2a to 100%. FIG. 12B shows the spectral spectrum of white light obtained by mixing light emitted from the LED 2a and lights converted by the fluorescent substances 91a, 91b, 92a, 93a, and 93b at this time. Since the conversion efficiency of the fluorescent substance 92a is high and the concentration thereof is also high, most of the violet light emitted from the LED 2b is converted, and the violet light emitted from the LED 2b is hardly radiated. Further, blue to red lights converted by the fluorescent substances 91a, 91b, 92a, 93a, and 93b are mixed. As a result, the radiant intensity of the red light is relatively strong, and it is possible to obtain illumination light having a relatively low color temperature of 3000 K.

In the third configuration example of the light emitting device 1 according to the present invention, the turn-on power of the LED 2a is changed while the LED 2b is being driven with a predetermined value (ON duty of 40% in this example), thereby changing the color temperature of the illumination light emitted from the light emitting device. A blue light component mainly depends on the light emitted from the second phosphor 92 (fluorescent substance 92a) that converts the light emitted from the LED 2b. Since the light emitted from the LED 2b is also converted by the third phosphor 93 (fluorescent substances 93a and 93b), it is possible to realize the illumination of the white light having good color balance which makes the object clearly visible while achieving a high color temperature.

Further, in the third configuration example, since the third phosphor 93 (fluorescent substances 93a and 93b) is excited by either of the LEDs 2a and 2b to emit light, a significant change in chromaticity occurs with difficulty even when suddenly changing a ratio of the turn-on powers of the LEDs 2a and 2b. Therefore, it is possible to more smoothly change the color temperature. For example, when fluorescent substances that emit green to yellow light are used as the third phosphor 93, the chromaticity of the illumination light is easy to shift in the direction indicated by the arrow "GY" in the chromaticity diagram shown in FIG. 7 while changing the color temperature of the illumination light between 5000 K and 3000 K.

That is, in this example, since the chromaticity is shifted in the direction of the arrow GY from a straight line connecting point A and point B shown in FIG. 7, the chromaticity of the illumination light is shifted along a black body radiation locus. As a result, it is possible to change the color temperature while maintaining the illumination light as natural white light.

Figure 13A:
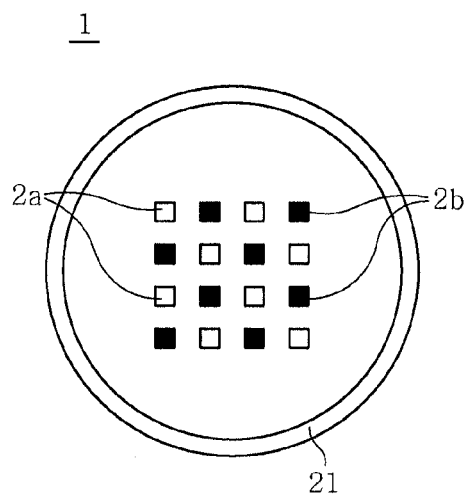
FIGS. 13A and 13B show pattern examples for arranging multiple types of solid state light emitting elements in the above configuration examples.

In the above embodiment, although the light source 2 includes one LED 2a and one LED 2b, it may include a plurality of LEDs 2a and a plurality of LEDs 2b. For example, the LEDs 2a and 2b may be arranged alternately such that different types of LEDs are adjacent to each other as shown in FIG. 13A. According to this configuration, since lights emitted from the LEDs 2a and 2b are easily mixed, it is possible to obtain white light with a more uniform chromaticity.

Figure 13B:
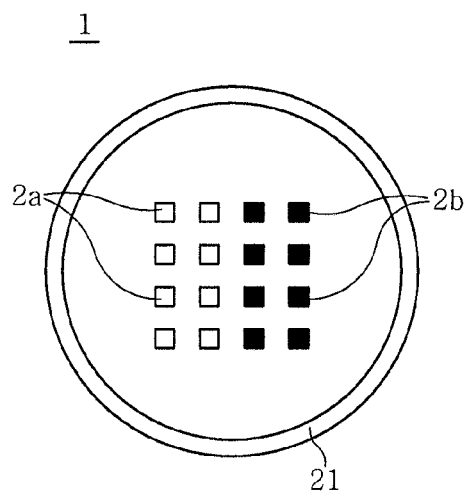

Alternatively, the LEDs 2a and 2b may be arranged to be separated as each group as shown in FIG. 13B. In the embodiment of the present invention, since chromaticity unevenness hardly occurs due to the wavelength conversion by the phosphors 9, the groups of the LEDs 2a and 2b may be arranged to be separated from each other in this way. In this case, the circuit configuration of the substrate 5 can easily be achieved, and a mounting process of the LEDs 2a and 2b becomes simple, thereby improving manufacturing efficiency.

Further, although the number of the LEDs 2a is the same as the number of the LEDs 2b in the embodiment, one of the number of the LEDs 2a and the number of the LEDs 2b may be greater than the other. For example, when the turn-on power of the LED 2b is varied in a range of 1 to 100% while the turn-on power of the LED 2a is being fixed to 20% as in the second configuration example of the light emitting device 1, a ratio of the number of the LEDs 2a to the number of the LEDs 2b may be set to, e.g., 1:5 such that the powers applied to each of the LEDs 2a and 2b is uniform.

Further, the present invention is not limited to the above embodiment, and various modifications can be made. For example, although three configuration examples of the light source 2 have been described in the above embodiment, two or more examples thereof may be incorporated into one illumination apparatus. Further, a configuration using two types of the LEDs 2a and 2b with different peak wavelengths has been illustrated, but three or more types of LEDs may be used.

For example, the light source 2 may further include LEDs that emit near-ultraviolet light having a peak wavelength of 350 nm, and phosphors that convert the near-ultraviolet light into blue light such that light in a violet to blue range is supplemented. In this case, by increasing the concentration of the first and second phosphors 91 and 92 in the wavelength converter 22 and converting the light emitted from the LEDs 2a and 2b into light of the longer wavelength side, it is possible to increase the maximum illumination intensity of the light emitting device. Further, by controlling the turn-on power of each LED, it is possible to further widen the variable range of the color temperature.

In the above embodiment, each of the first to third phosphors includes two fluorescent substances in which the excitation wavelength is common to and the peak wavelength is different from each other. However, the present invention is not limited thereto, and each of the first to third phosphors may include three or more fluorescent substances in which the excitation wavelength is common to and the peak wavelength is different from each other. For example, in the first configuration example, either of the first and second phosphors may include two or more fluorescent substances in which the excitation wavelength is common to and the peak wavelength is different from each other.

Although a surface mounted device (SMD) type light emitting device as shown in FIG. 3 has been described in the above embodiment, the present invention is not limited thereto. The light emitting device of the present invention may be provided, e.g., in a chip on board (COB) type in which a plurality of LED chips are mounted on a mounting substrate. Alternatively, the light emitting device of the present invention may include a plurality of SMD type light emitting devices shown in FIG. 3 which are mounted on a mounting substrate.

Further, a case where the light emitting device according to the present invention is incorporated into the illumination system as shown in FIGS. 2A and 2B and lighting of the light emitting device is controlled by the controller provided in the power supply unit of the illumination system has been described in the above embodiment. However, the present invention is not limited thereto, and it may be applied to an illumination apparatus such as an LED bulb, a lamp unit, and a power supply circuit built-in LED unit. Hereinafter, examples of an illumination apparatus and a illumination system using the light emitting device in accordance with the present invention will be described with reference to FIGS. 14A to 15B.

Figure 14A:
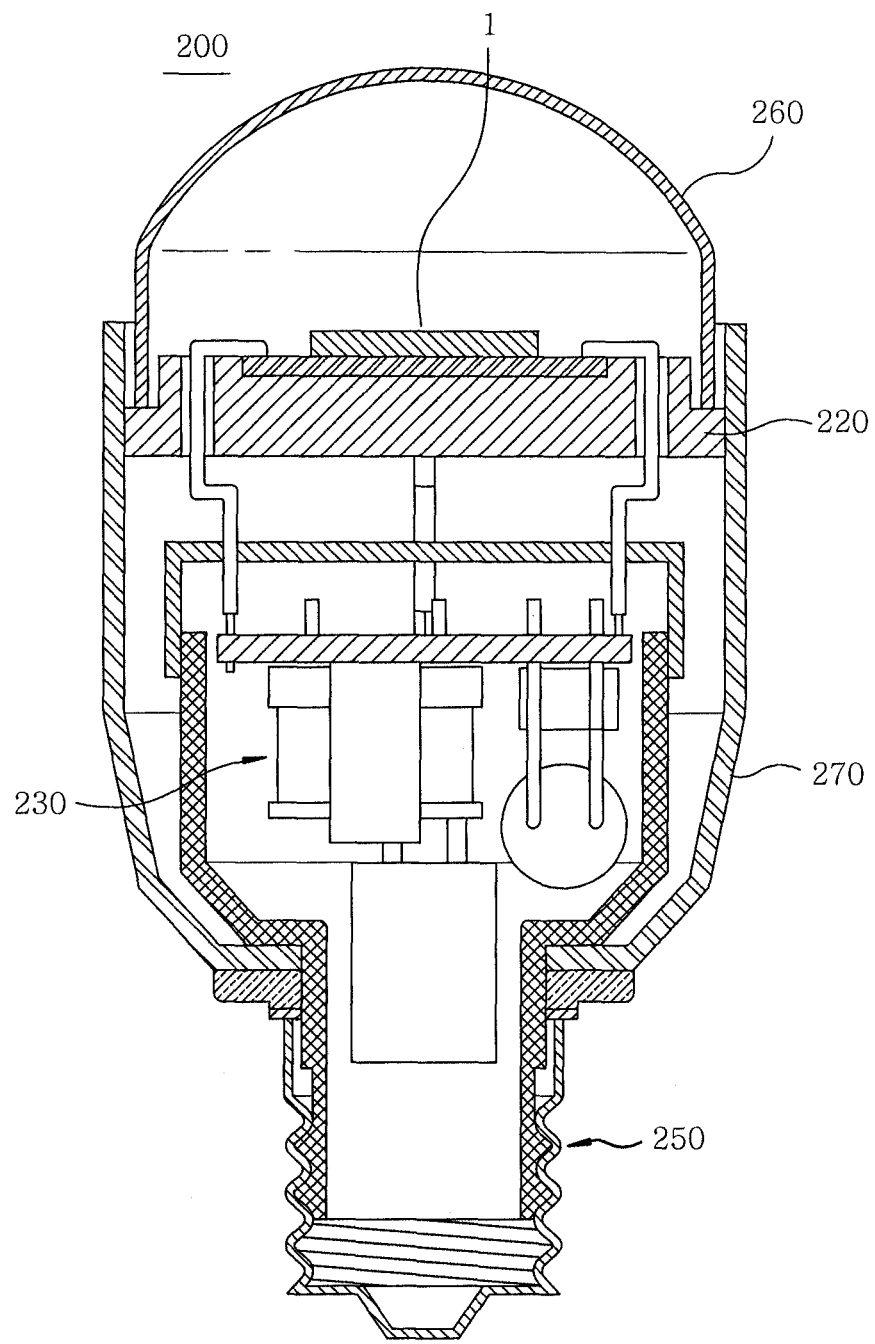
FIGS. 14A and 14B illustrate examples of an illumination apparatus to which the light emitting device in accordance with the present invention is applicable.

FIG. 14A illustrates an LED bulb 200 as an example of an illumination apparatus. As shown in FIG. 14A, the light emitting device 1 is mounted on a holder 220. The holder 220 is made of a high thermal conductive material, e.g., aluminium, so that heat from the light emitting device 1 can be dissipated to a housing 270 with high efficiency. The controller 4 is built into a power supply unit 230. A glove 260 covers the light emitting device 1. Further, the glove 260 is formed in a substantially dome shape to cover the light emitting device 1, and an open end thereof is fixed to the housing 270 and the holder 220 by an adhesive.

The housing 270 is formed in, e.g., a cylindrical shape. The light emitting device 1 is disposed at one end portion of the housing 270, and a screw cap 250 is disposed on the other end portion of the housing 270. In order to function as a heat dissipating member (heat sink) to dissipate heat from the light emitting device 1, the housing 270 is also formed of a material with good thermal conductivity, e.g., aluminum.

With the illumination apparatus shown in FIG. 14A, it is possible to achieve compatibility with an incandescent lamp since the LED bulb 200 is easily installed into a socket made for the incandescent lamp with the screw cap 250, in addition to the effects of the present invention.

Figure 14B:
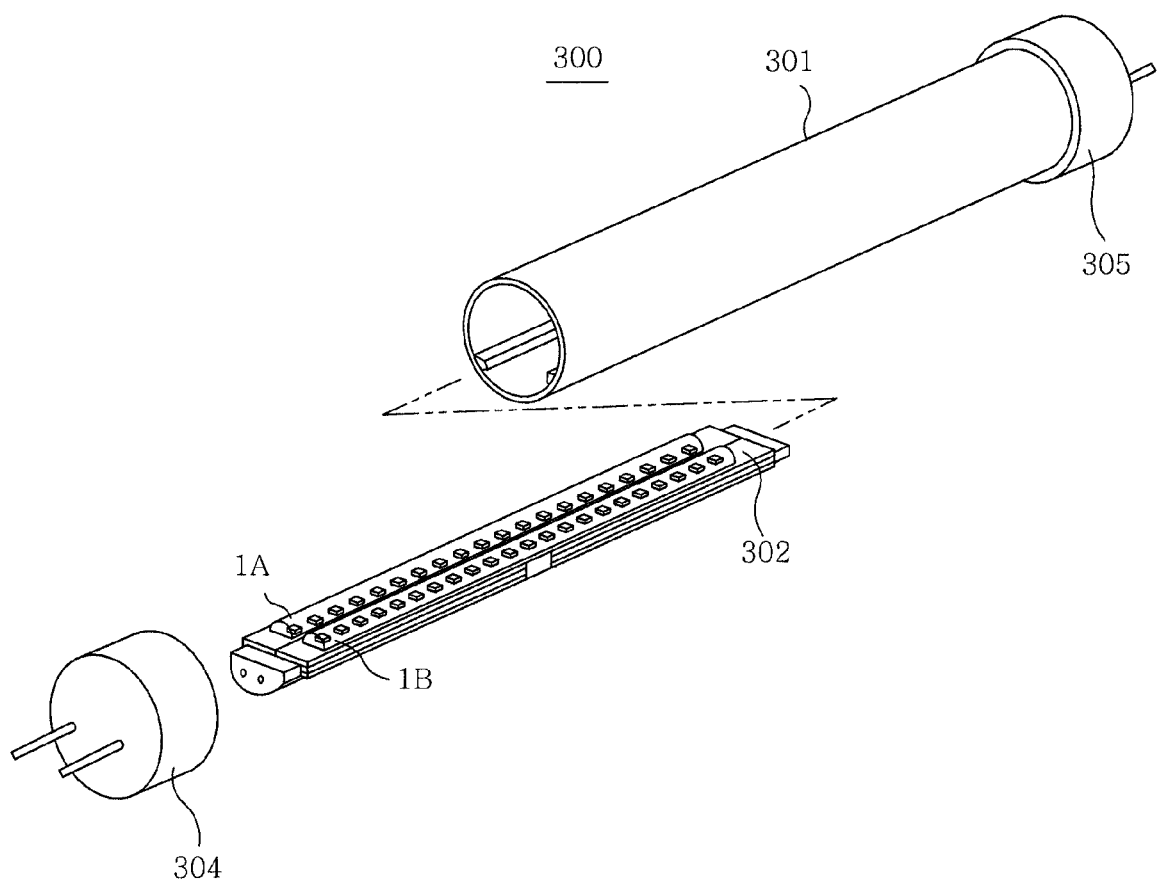

FIG. 14B illustrates an illumination apparatus 300 in which multiple light emitting devices according to the present invention is used. As shown in FIG. 14B, the illumination apparatus 300 includes two light emitting devices 1A and 1B. The illumination apparatus 300 includes an elongated tubular housing 301, a base 302 disposed in the housing 301, and a pair of caps 304 and 305 attached to both ends of the housing 301. The light emitting devices 1A and 1B are mounted on the base 302.

The housing 301 has an elongated tubular shape having openings at both ends, and accommodates the base 302 and the light emitting devices 1A and 1B. The material of the housing 301 is not particularly limited, but it is preferably a light transmitting material. As the light transmitting material, for example, resin such as plastic, glass, or the like may be used. Further, the cross-sectional shape of the housing 301 is not particularly limited, and may be a circular ring shape or polygonal ring shape. The base 302 preferably functions as a heat sink for dissipating the heat from the light emitting devices 1A and 1B. To this end, the base 302 is preferably formed of a material with high thermal conductivity such as metal.

Since the illumination apparatus 300 shown in FIG. 14B is easily installed into a socket made for a straight tubular florescent lamp with the caps 304 and 305, it is possible to ensure compatibility with the straight tubular florescent lamp, in addition to the effects of the present invention.

Figure 15A:
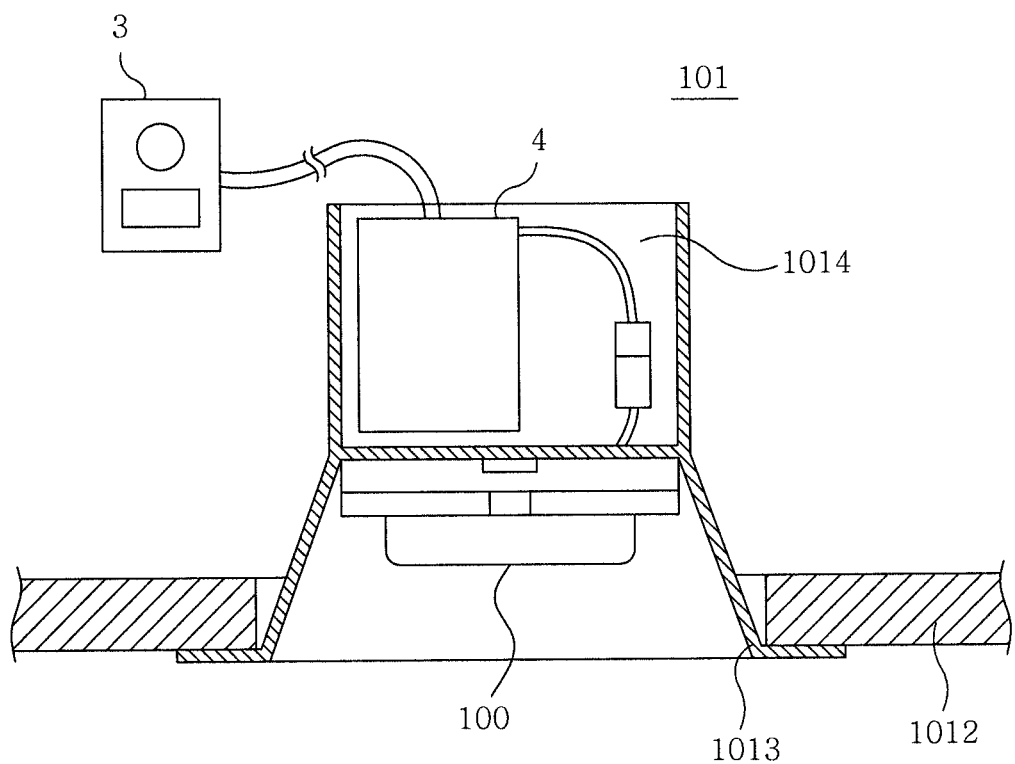
FIGS. 15A and 15B depict examples of an illumination system to which the light emitting device in accordance with the present invention is applicable.

Next, FIG. 15A illustrates an illumination system 101 using the illumination apparatus 100 shown in FIG. 1. As illustrated, the illumination system 101 is, e.g., a down light mounted to be embedded in a ceiling 1012. The illumination apparatus 100 is detachably installed in a receiving portion of a frame 1013. The controller 4 is provided in a power supply unit 1014, and controls the illumination apparatus 100 in response to the manipulation of the color temperature setting unit 3 by a user.

In the illumination system 101 shown in FIG. 15A, the thin type illumination apparatus 100 can be detachably installed. Therefore, it is possible to enhance usage convenience in addition to the effects of the present invention.

Figure 15B:
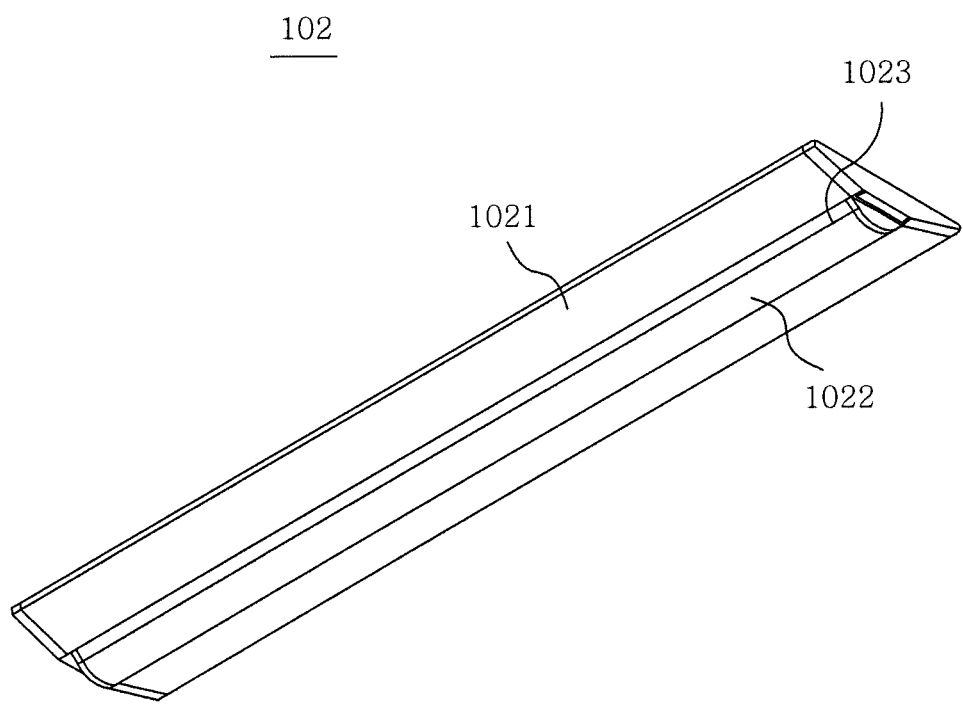

FIG. 15B illustrates a ceiling direct mounting type illumination system 102 in which the light emitting device 1 according to the present invention can be applied. The illumination system 102 includes a main body 1021 which is directly attached to a ceiling member (not shown). The light emitting device 1 (not shown) is attached to the main body 1021 via a plate-shaped attachment member 1023. Further, the light emitting device 1 is covered by a light transmitting cover 1022 made of resin such as plastic or glass.

The illumination system 102 shown in FIG. 15B can replace an illumination system equipped with a straight tubular florescent lamp while providing increased efficiency in addition to the effects of the present invention.

Although the illumination apparatus and the illumination system using the light emitting device according to the present invention have been illustrated in the above embodiment, they are merely exemplary, and the light emitting device according to the present invention may be used in various illumination apparatuses and illumination systems.

While the invention has been shown and described with respect to the embodiments, it will be understood by those skilled in the art that various changes and modifications may be made without departing from the scope of the invention as defined in the following claims.

What is claimed is:

1. A light emitting device comprising:
   one or more first solid state light emitting elements emitting a first light having a first peak wavelength;
   one or more second solid state light emitting elements emitting a second light having a second peak wavelength shorter than the first peak wavelength; and
   a wavelength converter including phosphors that convert wavelengths of the first and the second solid state light emitting elements,
   wherein the wavelength converter is disposed to cover the first and the second solid state light emitting elements,
   wherein the phosphors include two or more of a first phosphor, a second phosphor, and a third phosphor, the first phosphor being excited only by the first light, the second phosphor being excited only by the second light and the third phosphor being excited by the first and the second light,
   wherein the first phosphor, the second phosphor or the third phosphor includes a plurality of fluorescent substances that have a same excitation wavelength and plural emission peak wavelengths different from each other,
   wherein the wavelength converter includes a first layer made of a sealing resin containing the first phosphor and a second layer made of a sealing resin containing the second phosphor, the first and the second layer being devoid of the second and the first phosphor, respectively, and
   wherein the first layer is disposed to cover the first and the second solid state light emitting elements and the second layer is disposed on the first layer.

2. The light emitting device of claim 1, wherein the number of the first solid state light emitting elements is greater than one and the number of the second solid state light emitting elements is greater than one.

3. The light emitting device of claim 1, wherein the phosphors includes the first phosphor and the second phosphor and the first phosphor scatters the second light, and the second phosphor scatters the first light.

4. A light emitting device comprising:
   one or more first solid state light emitting elements emitting a first light having a first peak wavelength;
   one or more second solid state light emitting elements emitting a second light having a second peak wavelength shorter than the first peak wavelength; and
   a wavelength converter including phosphors that convert wavelengths the first and the second solid state light emitting elements,
   wherein the wavelength converter is disposed to cover the first and the second solid state light emitting elements,
   wherein the phosphors include two or more of a first phosphor, a second phosphor, and a third phosphor, the first phosphor being excited only by the first light, the second phosphor being excited only by the second light and the third phosphor being excited by the first and the second light,
   wherein the number of the first solid state light emitting elements is greater than one and the number of the second solid state light emitting elements is greater than one, and
   wherein the first and the second solid state light emitting elements are arranged alternately such that one of the first solid state light emitting elements is adjacent to one of the second solid state light emitting elements.

5. A light emitting device comprising:
   one or more first solid state light emitting elements emitting a first light having a first peak wavelength;
   one or more second solid state light emitting elements emitting a second light having a second peak wavelength shorter than the first peak wavelength; and
   a wavelength converter including phosphors that convert wavelengths the first and the second solid state light emitting elements,
   wherein the wavelength converter is disposed to cover the first and the second solid state light emitting elements,
   wherein the phosphors include two or more of a first phosphor, a second phosphor, and a third phosphor, the first phosphor being excited only by the first light, the second phosphor being excited only by the second light and the third phosphor being excited by the first and the second light,
   wherein the number of the first solid state light emitting elements is greater than one and the number of the second solid state light emitting elements is greater than one, and
   wherein a group of the first solid state light emitting elements and a group of the second solid state light emitting elements are separately arranged on a group basis.

6. An illumination apparatus comprising:
   the light emitting device described in claim 2; and
   a controller configured to control an output power of each of the first and the second solid state light emitting elements to vary a color temperature of mixed light which is obtained by mixing lights emitted from the first and the second solid state light emitting elements and the phosphors.

7. The illumination apparatus of claim 6, wherein the controller changes the color temperature by varying the output powers of both of a group of the first light emitting elements and a group of the second light emitting elements.

8. The illumination apparatus of claim 6, wherein the controller changes the color temperature by varying the output power of one group of a group of the first light emitting elements and a group of the second light emitting elements while fixing the output power of the other group to a predetermined value.

9. An illumination apparatus comprising:
the light emitting device described in claim 1; and
a controller configured to control an output power of each of the first and the second solid state light emitting elements to vary a color temperature of mixed light which is obtained by mixing lights emitted from the first and the second solid state light emitting elements and the phosphors.

10. An illumination system comprising the illumination apparatus described in claim 6.

11. An illumination system comprising the illumination apparatus described in claim 9.

* * * * *